United States Patent
Leinonen et al.

(10) Patent No.: US 9,887,714 B2
(45) Date of Patent: Feb. 6, 2018

(54) REMOTE RADIO HEAD AND ASSOCIATED METHOD

(71) Applicant: Telefonaktiebolaget LM Ericsson (publ), Stockholm (SE)

(72) Inventors: Marko E. Leinonen, Haukipudas (FI); Kauko Heinikoski, Oulu (FI)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 15/319,298

(22) PCT Filed: Jul. 4, 2014

(86) PCT No.: PCT/SE2014/050860
§ 371 (c)(1),
(2) Date: Dec. 15, 2016

(87) PCT Pub. No.: WO2016/003343
PCT Pub. Date: Jan. 7, 2016

(65) Prior Publication Data
US 2017/0134056 A1 May 11, 2017

(51) Int. Cl.
*H04B 1/04* (2006.01)
*H04W 88/08* (2009.01)
(Continued)

(52) U.S. Cl.
CPC ......... *H04B 1/0475* (2013.01); *H04B 1/0017* (2013.01); *H04B 1/1027* (2013.01);
(Continued)

(58) Field of Classification Search
USPC ...... 375/297, 296, 295, 222; 455/507, 562.1
See application file for complete search history.

(56) References Cited

U.S. PATENT DOCUMENTS

2011/0302390 A1* 12/2011 Copeland ............. H04B 1/0003
712/2
2012/0314797 A1* 12/2012 Kummetz ............... H04L 27/34
375/295
(Continued)

FOREIGN PATENT DOCUMENTS

EP        2 744 254 A1     6/2014
JP        2014-39138 A     2/2014
(Continued)

OTHER PUBLICATIONS

International Search Report, International Application No. PCT/SE2014/050860, dated Mar. 18, 2015.
(Continued)

*Primary Examiner* — Eva Puente
(74) *Attorney, Agent, or Firm* — Sage Patent Group

(57) ABSTRACT

It is provided a remote radio head configured to provide a radio interface for a network node. The remote radio head comprising an antenna, an analog interface for connecting with the network node, radio frequency (RF) circuitry configured to convert between intermediate frequency signals of the analog interface and RF signals of the antenna, digital circuitry configured to process transmission and/or reception signals, a first analog to digital converter (ADC) connected to the digital circuitry, and a first digital to analog converter (DAC) connected to the digital circuitry. The first ADC, the digital circuitry, and the first DAC are connected between the antenna and the analog interface for receiving or transmitting radio signals. A corresponding method is also presented.

19 Claims, 3 Drawing Sheets

(51) Int. Cl.
    *H04B 1/10* (2006.01)
    *H04B 1/00* (2006.01)
    *H04L 27/26* (2006.01)

(52) U.S. Cl.
    CPC ....... *H04L 27/2614* (2013.01); *H04W 88/085* (2013.01); *H04B 2001/0408* (2013.01); *H04B 2001/0425* (2013.01)

(56) References Cited

U.S. PATENT DOCUMENTS

| | | | | |
|---|---|---|---|---|
| 2013/0059617 A1* | 3/2013 | Li | ................ | H01Q 1/246 455/507 |
| 2013/0094549 A1* | 4/2013 | Ridel | ................ | H04W 88/085 375/222 |
| 2015/0358054 A1* | 12/2015 | Lemson | ........... | H04B 10/25753 455/562.1 |
| 2015/0381217 A1* | 12/2015 | Kim | ................ | H03F 1/3247 375/297 |
| 2016/0080009 A1* | 3/2016 | Bilek | ................ | H04B 1/0475 375/297 |
| 2016/0112222 A1* | 4/2016 | Pashay-Kojouri | ...... | H03F 3/193 375/296 |
| 2016/0211893 A1* | 7/2016 | Kim | ................ | H04W 88/085 |

FOREIGN PATENT DOCUMENTS

| | | |
|---|---|---|
| KR | 10-2012-0057246 A | 6/2012 |
| WO | WO 2010/092166 A2 | 8/2010 |
| WO | WO 2011/148939 A1 | 12/2011 |

OTHER PUBLICATIONS

Written Opinion of the International Searching Authority, International Application No. PCT/SE2014/050860, dated Mar. 18, 2015.

* cited by examiner

… (1)

REMOTE RADIO HEAD AND ASSOCIATED METHOD

CROSS REFERENCE TO RELATED APPLICATION

This application is a 35 U.S.C. §371 national stage application of PCT International Application No. PCT/SE2014/050860, filed on Jul. 4, 2014, the disclosure and content of which is incorporated by reference herein in its entirety. The above-referenced PCT International Application was published in the English language as International Publication No. WO/2016/003343 A1 on Jan. 7, 2016.

TECHNICAL FIELD

The invention relates to a remote radio head and associated method for providing a radio interface for a network node.

BACKGROUND

When deploying wireless communication networks, there is a balance between coverage and capacity. On the one hand, a few large cells can provide great coverage but at a cost of reduced capacity. On the other hand, a scenario with many small cells creates better capacity and throughput, but may not provide the desired coverage. Hence, there is often a combination of larger cells to provide sufficient coverage with smaller cells to provide better capacity.

However, providing coverage indoors using many small cells can be quite costly, with a radio base station for each such small cell. Moreover, when the cells get too small, wireless terminals moving in the network cause a great number of handovers which causes significant overhead.

One solution to this problem is to use remote radio heads, where several remote radio heads connected to the same radio base station share the same cell. In this way, a single radio base station can provide coverage in different parts of a building by placing the remote radio heads appropriately. Moreover, the wireless terminal can move between the coverage of different remote radio heads while staying within the same cell, thus avoiding causing handovers.

However, when analogue signals are used for the transmission of signals between the radio base station and the remote radio head, there is a significant risk of noise and/or interference, which can have significant effects on performance.

SUMMARY

It is an object to provide a remote radio head which provides a better way to handle imperfections due to analogue signal transfer.

According to a first aspect it is provided a remote radio head configured to provide a radio interface for a network node. The remote radio head comprising: an antenna; an analogue interface for connecting with the network node; circuitry configured to convert between intermediate frequency signals of the analogue interface and radio frequency, RF, signals of the antenna; digital circuitry configured to process transmission and/or reception signals; a first analogue to digital converter, ADC, connected to the digital circuitry; and a first digital to analogue converter, DAC, connected to the digital circuitry; wherein the first ADC, the digital circuitry, and the first DAC are connected between the antenna and the analogue interface for receiving or transmitting radio signals.

The digital circuitry may be configured to digitally filter out unwanted spectral components. For instance, the digital circuitry may comprises a processor and a memory storing instructions that, when executed by the processor, causes the digital circuitry to digitally filter out unwanted spectral components.

The remote radio head may further comprise: a second ADC connected between the antenna and the digital circuitry and a second DAC, connected between the analogue interface and the digital circuitry; wherein the first ADC is connected between the analogue interface and the digital circuitry, and the first DAC is connected between the antenna and the digital circuitry.

The digital circuitry may further be configured to perform amplitude equalisation to compensate for a non-ideal frequency response of a cable between the remote radio head and the network node. Optionally, the equalisation can also comprise compensation for latencies. For instance, the digital circuitry may comprises a processor and a memory storing instructions that, when executed by the processor, causes the digital circuitry to compensate for a non-ideal frequency response of a cable between the remote radio head and the network node.

The digital circuitry may further be configured to extract a plurality of separate channels of respective separate spectral bands from a single input signal. For instance, the digital circuitry may comprises a processor and a memory storing instructions that, when executed by the processor, causes the digital circuitry to extract a plurality of separate channels of respective separate spectral bands from a single input signal.

The digital circuitry may further be configured to add a known pseudorandom noise like signal to a received signal for desensitation. For instance, the digital circuitry may comprises a processor and a memory storing instructions that, when executed by the processor, causes the digital circuitry to add a known pseudorandom noise like signal to a received signal for desensitation.

The digital circuitry may further be configured to perform digital predistortion to compensate for non-linear transmission. For instance, the digital circuitry may comprises a processor and a memory storing instructions that, when executed by the processor, causes the digital circuitry to perform digital predistortion to compensate for non-linear transmission.

The digital circuitry may further be configured to perform peak to average ratio reduction of the transmission signal. For instance, the digital circuitry may comprises a processor and a memory storing instructions that, when executed by the processor, causes the digital circuitry to perform peak to average ratio reduction of the transmission signal.

The digital circuitry may further be configured to control the RF circuitry using any one or more of the following parameters: a biasing condition of a power amplifier, an antenna impedance of a component connected to antenna, filter response of the RF radio circuitry, to change operation frequency of the RF circuitry. For instance, the digital circuitry may comprises a processor and a memory storing instructions that, when executed by the processor, causes the digital circuitry to control the RF circuitry using any one or more of the following parameters: a biasing condition of a power amplifier, an antenna impedance of a component connected to antenna, filter response of the RF radio circuitry, to change operation frequency of the RF circuitry.

The digital circuitry may be connected to a bi-directional control interface for control by an external node.

According to a second aspect it is provided a method for providing a radio interface for a network node. The method is performed in a remote radio head connected to the network node and comprising the steps of: converting, in a first analogue to digital converter, an analogue signal to a digital signal for digital circuitry of the remote radio head, the analogue signal being provided by an analogue interface of the remote radio head or by an antenna of the remote radio head, the analogue interface being connected with the network node; digitally processing transmission and/or reception signals; converting in a first digital to analogue converter, a digital signal from the digital circuitry to an analogue signal, the analogue signal being provided to the analogue interface or the antenna; and converting between intermediate frequency signals of the analogue interface and radio frequency, RF, signals of the antenna.

The step of digitally processing may comprise the step of: digitally filtering out unwanted spectral components in the digital circuitry.

The method may further comprise: converting, in a second ADC, an analogue signal from the antenna to a digital signal for the digital circuitry; and converting in a second DAC, a digital signal from the digital circuitry to an analogue signal being provided to the analogue interface; wherein the step of converting in the first ADC comprises converting an analogue signal from the analogue interface to a digital signal for the digital circuitry; and the step of converting in a first DAC comprises converting a digital signal from the digital circuitry to an analogue signal being provided to the antenna.

The method may further comprise the step of: performing amplitude equalisation to compensate for a non-ideal frequency response of a cable between the remote radio head and the network node.

The step of digitally processing may comprise the step of: extracting a plurality of separate channels of respective separate spectral bands from a single input signal.

The step of digitally processing may comprise the step of: adding a known pseudorandom noise like signal to a received signal for desensitation.

The step of digitally processing may comprise the step of: performing digital predistortion to compensate for non-linear transmission.

The step of digitally processing may comprise the step of: performing peak to average ratio reduction of the transmission signal.

The step of digitally processing may comprise the step of: controlling the RF circuitry using any one or more of the following parameters: a biasing condition of a power amplifier, an antenna impedance of a component connected to antenna, a filter response of the RF radio circuitry, or operation frequency of the RF circuitry.

The digital circuitry may be connected to a bi-directional control interface for control by an external node.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The invention is now described, by way of example, with reference to the accompanying drawings, in which.

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Figure 1A:
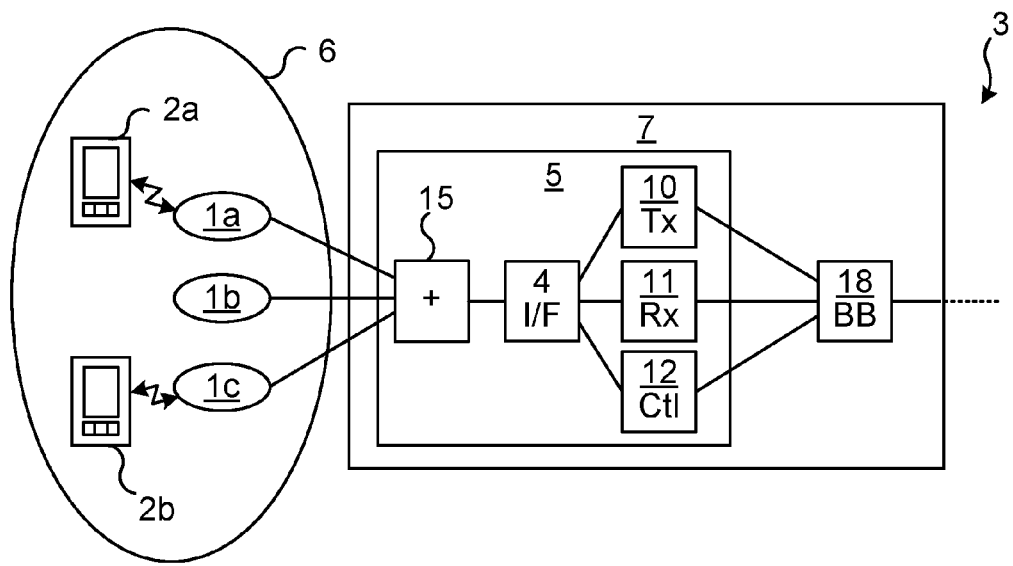
FIGS. 1A-B are schematic architecture diagrams illustrating environments where embodiments presented herein can be applied.
Figure 1B:
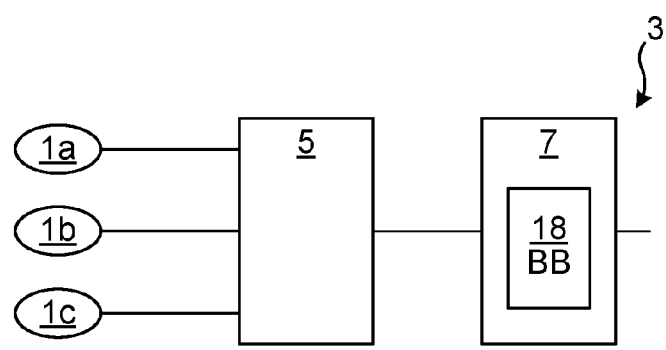

FIGS. 1A-B are schematic architecture diagrams illustrating wireless communication networks 3 being environments where embodiments presented herein can be applied. Considering first FIG. 1A, the wireless communication network 3 comprises a number of remote radio heads 1a-c for installation in locations where traditional deployment with antennas being co-located with the radio base stations is not ideal. For example, the wireless communication network 3 can be installed indoors, such as in an office, shopping centre, train station or airport.

It is to be noted that, while the embodiments presented herein are described as implemented using LTE (Long Term Evolution), any applicable communication standard may be used, such as any one or a combination of LTE-SAE (Long Term Evolution-System Architecture Evolution), W-CDMA (Wideband Code Division Multiplex), EDGE (Enhanced Data Rates for GSM (Global System for Mobile communication) Evolution), GPRS (General Packet Radio Service), CDMA2000 (Code Division Multiple Access 2000), any standard for Wireless Local Area Networks such as any one of the IEEE 802.11 standards, or any other current or future wireless network, such as LTE-Advanced, as long as the principles described hereinafter are applicable.

A network node 7 (e.g. a radio base station or wireless access point) here comprises a baseband module 18 and an indoor radio unit (IRU) 5, which in fact does not need to be deployed indoors. The IRU 5 is in turn connected to, and is a link for, a number (in this example three) remote radio heads 1a-c via respective cables. In this way, the remote radio heads provide a radio interface for the network node 7 for uplink and downlink communication. Each cable may comprise a plurality of wire pairs. For instance, if MIMO (Multiple Input Multiple Output) is employed, separate MIMO streams may be provided on separate wire pairs. Even in the MIMO case, there can be unused wire pairs.

The remote radio heads 1a-c connected to the IRU 5 are part of a single cell 6 and thus share a cell identifier. Antennas do not need to be included in this embodiment of the network node 7 or the IRU 5, as the remote radio heads 1a-c provide the antennas for the wireless link to one or more wireless terminals 2a-b. The wireless link provided by the remote radio heads 1a-c includes both downlink (DL)

communication to the wireless terminals 2a-b and uplink (UL) communication from the wireless terminals 2a-b. The term wireless terminal is also known as mobile communication terminal, user equipment (UE), station (STA), mobile terminal, user terminal, user agent, machine-to-machine devices etc., and can be, for example, what today is commonly known as a mobile phone or a tablet computer/laptop with wireless connectivity or fixed mounted terminal.

In radio communication systems, the data is transmitted and received over the air at a specific radio frequency—either the same for transmission and reception or on separate frequencies. This is often called the radio frequency (RF) or the carrier frequency.

There are many different carrier frequencies, depending on regional spectrum allocation and spectrum license rights. To create a common radio implementation supporting this variety of carrier frequencies, a second set of frequencies is used herein, denoted the Intermediate Frequency (IF), which is used for communication on the cables between the IRU 5 and the remote radio heads 1a-c.

For uplink communication, the remote radio heads 1a-c downconvert a received (uplink) signal to IF and send it over its cable to the IRU 5 in analogue format. The received analogue IF signals are combined in a combiner 15 and fed to an interface circuitry 4. The interface circuitry 4 extracts the received IF signal from the interface and forwards it to the RX (reception) back-end 11. In one embodiment, the RX backend 11 comprises an Analogue to Digital Converter (ADC) which samples the signal on IF and converts to a digital signal. In another embodiment, the RX back-end 11 first downconverts the received signals from IF to an analogue BB (baseband) signal which is further filtered and converter to a digital signal in an analogue to digital converter. The RX back-end 11 sends the combined received signals in digital form to the baseband module 18 for further processing such as demodulation, decoding, etc. as known in the art per se.

Optionally, the remote radio heads 1a-c are also powered over the respective cables.

For downlink communication, the process works in reverse to the uplink. Hence, the baseband module 18 sends a digital BB signal for transmission to a TX (transmission) back-end 10 of the IRU 5. In one embodiment, the TX back-end 10 converts the digital BB signal to an analogue signal in IF directly in a Digital to Analogue Converter (DAC). In another embodiment, the TX back-end 10 first pulse shapes the digital BB signal to an analogue transmission signal and upconverts the transmission signal to IF in the analogue domain. The transmission signal in IF is then inserted onto the interface by the interface circuitry 4, and provided to the combiner 15 which also functions as a splitter, providing the same transmission signal in IF to all connected remote radio heads 1a-c over the respective cables. The remote radio heads 1a-c then upconvert the IF signal to RF and transmit the RF signal over the air to the wireless terminals 2a-b.

The remote radio heads 1a-c convert from IF to RF for downlink transmission and from RF to IF for uplink reception. Conversely, the IRU converts from digital BB to IF for downlink transmission and from IF to digital BB for uplink reception.

By using analogue IF signals over the cables instead of RF, cheaper, widely deployed electrical cables can be used, such as Ethernet LAN cabling. In this way, existing indoor cabling can many times be reused during installation, which significantly saves cost and installation time.

Moreover, there is a control link between a processor 12 in the IRU 5 and each remote radio head 1a-c. This control link can be used e.g. to set the RF frequency used for downconversion and upconversion in the remote radio heads 1a-c.

The transmission and reception is under the control of the MAC (Media Access Control) scheduler in the baseband module 18. The MAC scheduler informs what transmissions should be made and informs, via the downlink signaling, the wireless terminals when to transmit and on which frequency and power.

It is to be noted that, although FIG. 1A shows the baseband module 18 connected to one IRU 5, each baseband module 18 can be connected to several IRUs. Each IRU may have its own cell or several IRUs may share a single cell.

It is to be noted that while the embodiment of FIG. 1A shows three remote radio heads 1a-c, there may be fewer or more remote radio heads connected to each IRU 5.

FIG. 1B is a schematic architecture diagram illustrating an alternative embodiment in terms of IRU 5 and network node 7. Here, the IRU 5 is separate, but connected to, the network node 7. The IRU 5 itself can be implemented e.g. as shown in FIG. 1A.

Figure 2:
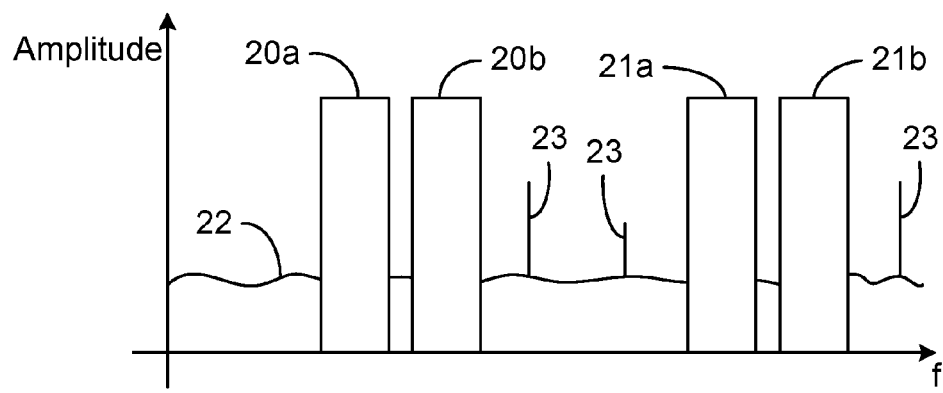
FIG. 2 is a schematic graph illustrating signal and noise/interference in the system of FIGS. 1A-B.

FIG. 2 is a schematic graph illustrating signal and noise/interference in the system of FIGS. 1A-B, as seen on a cable between one of the remote radio heads and the IRU 5. The horizontal axis represents frequency. The vertical axis represents amplitude, or power.

There are here two received signals 20a-b in separate frequency bands. Moreover, there are two transmission signals 21a-b in two separate frequency bands. Furthermore, there is a general noise 22 and noise spurs 23 which reduce the signal to noise ratio (SNR).

It is to be noted that control signalling is not shown in FIG. 2.

Figure 3:
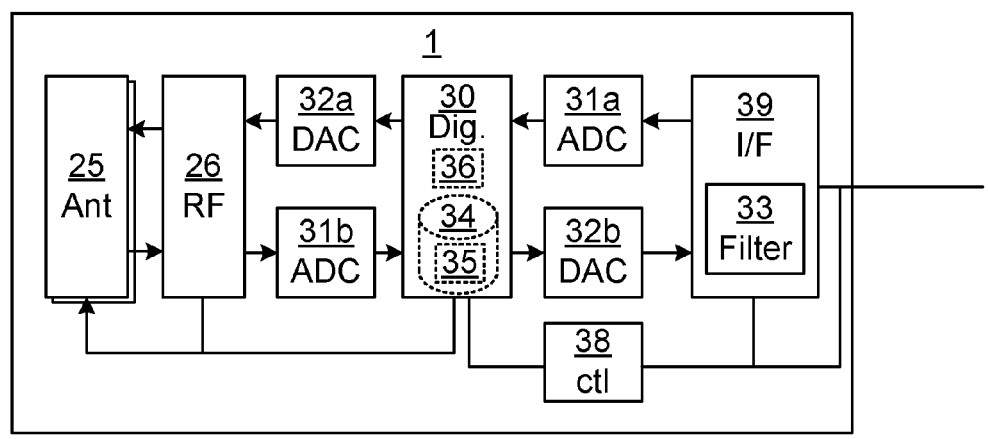
FIG. 3 is a schematic architecture diagram illustrating components of an embodiment of a remote radio head of FIGS. 1A-B.

FIG. 3 is a schematic architecture diagram illustrating components of an embodiment of a remote radio head of FIGS. 1A-B, here represented by a single remote radio head 1. As explained above, the remote radio head is configured to provide a radio interface for a network node 7.

The remote radio head 1 comprises an analogue interface 39 for connecting with the network node 5.

A first ADC 31a is connected between the analogue interface 39 and digital circuitry 30. A first DAC 32a is connected between the digital circuitry 30 and RF circuitry 26. A second ADC 31b is connected between the RF circuitry 26 and the digital circuitry 30. A second DAC 32b is connected between the digital circuitry 30 and analogue interface 39.

In this way, the first ADC 31a and the first DAC 32a pass transmission signals through the digital circuitry 30. It is to be noted that the first ADC 31a can comprise circuitry for parallel conversion of signal from separate analogue signals, e.g. provide on separate wire pairs and/or separate cables. It is to be noted that the first DAC 32a can comprise circuitry for parallel conversion of separate digital signals, e.g. to provide separate transmission signals for separate antennas. The digital circuitry 30 can in this way use digital processing to improve the digital version of the transmission signal prior to transmission.

Analogously, the second ADC 31b and the second DAC 32b pass reception signals through the digital circuitry 30. The digital circuitry 30 can in this way use digital processing to improve the digital version of the reception signal prior to providing the signal to the network node. It is to be noted that the second ADC 31b can comprise circuitry for parallel conversion of signal from separate analogue signals, e.g.

provided on separate antennas. It is to be noted that the second DAC 32b can comprise circuitry for parallel conversion of separate digital signals, e.g. to provide separate analogue signals for separate wire pairs and/or separate cables.

It is to be noted that it is sufficient that either the transmission signal or the reception signal is provided through the digital circuitry 30.

In one embodiment digital processing is only supported for transmission, whereby the remote radio head 1 is provided with only the first ADC 31a and the first DAC 32a and not the second ADC 31b nor the second DAC 32b.

In one embodiment digital processing is only supported for reception, whereby the remote radio head 1 is provided with only the second ADC 31b and the second DAC 32b and not the first ADC 31a nor the first DAC 32a.

In one embodiment digital processing is supported for both transmission and reception, whereby the remote radio head 1 is provided with the first ADC 31a, the first DAC 32a, the second ADC 31b and the second DAC 32b.

The digital circuitry 30 can be implemented using any suitable digital logic device, e.g. a digital signal processor (DSP), ASIC (Application Specific Integrated Circuit), FPGA (Field-Programmable Gate Array), Central Processing Unit (CPU), discrete logical components or any combination of these. Optionally, when the digital circuitry 30 is implemented comprising a processor 36, such as a DSP or CPU, the digital circuitry 30 also comprises an instruction memory 34 comprising software instructions 35 being executable by the DSP or the CPU. Hence, the 36 can be configured to execute software instructions to perform a digital processing step 40 of the methods described with reference to FIGS. 4A-C below.

The memory 34 can be any combination of read and write memory (RAM) and read only memory (ROM). The memory 34 comprises persistent storage, which, for example, can be any single one or combination of magnetic memory, optical memory, or solid state memory.

The RF circuitry 26 comprises suitable analogue components to prepare a transmission signal before it is passed to an antenna 25. For instance, the RF circuitry can upconvert transmission signals from IF (see 21a-b of FIG. 2), as received over the cable from the IRU 5, to RF for transmission using the antenna 25 to wireless terminals. Moreover the RF circuitry 26 comprises a power amplifier for amplifying transmission signals to a suitable level prior to transmitting on the antenna.

The RF circuitry 26 also comprises suitable analogue components to process received signals from the antenna 25. For instance, the RF circuitry can downconvert received signals in RF to IF (see 20a-b of FIG. 2) for transfer over the cable to the IRU 5.

The upconversion and downconversion of signals can e.g. be performed by mixing an input signal with a local oscillator. The frequency of the local oscillator determines the frequency shift and this frequency is configurable using a control signal.

The RF circuitry 26 may optionally comprise antenna tuning circuitry for adjusting the impedance.

The antenna 25 is provided to transmit and receive radio signals, e.g. to the wireless terminals 2a-b of FIG. 1. It is to be noted the antenna may comprise one or more antenna elements. For instance, if MIMO (Multiple Input Multiple Output) is employed, the antenna 25 comprises at least two antenna elements.

It is to be noted that while the remote radio head 1 is here shown comprising two antennas, there may be more antennas, e.g. four, eight, sixteen, etc.

The interface circuitry 39 inserts and extracts (multiplexes and demultiplexes) the transmission IF signal, the received IF signal and the control signal onto/from the cable, e.g. using low pass filters and high pass filters. For instance, with reference to FIG. 2, a high pass filter with a cut off frequency between the reception signals 20a-b and the transmission signals 21a-b can filter out the reception signals 20a-b and provide only the transmission signals 21a-b to the first ADC 31a. Hence, the interface circuitry 39 may use different frequency bands for uplink signals, downlink signals and control signals to thereby multiplex all of these on a single cable to the IRU. The analogue interface may comprise analogue filters 33 configured to filter out unwanted frequencies on reception and/or transmission signals. When digital filtering is performed by the digital circuitry 30, the analogue filtering only needs to be rough filtering and does not need to be particularly accurate, saving costs on components and configuration time for an engineer, which may otherwise be needed for filter tuning.

A bi-directional control interface 38 communicates with the processor 12 of the IRU. The control interface 38 may be implemented in at least three different ways: a control interface directly from an analogue signal from the IRU, a control signal from a filtered analogue signal, i.e. from the analogue filters 33; or a control signal from digitalized signal from the digital circuitry 30.

For example, the control interface 38 may be used to receive commands from the processor 12 to alter frequencies used by RF circuitry 26 for upconversion and/or downconversion or to change power level of the transmission. The control interface 38 can be implemented using software instructions such as a computer program executed by a processor (CPU, DSP and/or microcontroller) and/or using only hardware, such as ASIC, FPGA, discrete logical components, etc.

Using the digital circuitry, the transmission signal can be improved in ways that are not possible or a lot more cumbersome using analogue signal processing. For instance, with reference to FIG. 2, unwanted spectral components of the general noise 22 and the noise spurs 23 can be digitally filtered out using a digital frequency filter, such as a band-pass filter. Digital frequency filters can be easily be implemented and with sharper cut-off frequency characteristics than most analogue filters. Moreover, digital frequency filters can be more specifically tailored to particular frequency band usage, since the digital frequency filters can easily be reconfigured if other frequency bands are used.

In one embodiment, the digital circuitry 30 is configured to perform amplitude equalisation to compensate for a non-ideal frequency response of a cable between the remote radio head 1 and the network node. This can be done after the effects of the non-ideal frequency response (for transmission signals) or prior to the effects of the non-ideal frequency response (for reception signals). Optionally or alternative, the digital circuitry 30 is configured to perform equalisation to compensate for latency differences.

In one embodiment, the digital circuitry 30 is configured to extract a plurality of separate channels of respective separate spectral bands from a single input signal. The separate channels can e.g. relate to separate MIMO streams and are thus fed to separate antennas (for transmission).

In one embodiment, the digital circuitry 30 is configured to add a known pseudorandom noise like signal to a received signal for desensitation. This improves near-far problems using an effect called desensitation. Near-far problems is when a received signal from one transmitter is significantly stronger than a received signal from another transmitter and both received signals are received concurrently on a shared communication medium, such as is the case with W-CDMA or any other CDMA based communication medium.

In one embodiment, the digital circuitry 30 is configured to perform digital predistortion (DPD) to compensate for non-linear transmission, e.g. due to a non-linear power amplifier in the RF circuitry.

In one embodiment, the digital circuitry 30 is configured to perform peak to average ratio reduction (also known as crest factor reduction) of the transmission signal. The peak to average ratio reduction improves power amplifier efficiency by enabling power amplifier to operate at higher efficiency level due to suppressed peak power of the transmission signal.

In one embodiment, the digital circuitry 30 is configured to control the RF circuitry 26 using any one or more of the following parameters: a biasing condition of a power amplifier, an antenna impedance of a component connected to antenna 25, filter response of the RF radio circuitry 25, to change operation frequency of the RF circuitry 26. The biasing condition can be changed to only use as much power as necessary for the power amplification, thus reducing overall power usage for the remote radio head. The operation frequency can e.g. be modified by changing the frequency of a local oscillator used in frequency upconversion and downconversion of the signals. The reason for this can e.g. be that a new operational RF band should be used for transmissions and/or reception. If the operational RF band(s) are changed, analogue the filter response of analogue filters may need to be adjusted also, by the digital circuitry 30 sending suitable control signals to the RF circuitry 26.

In one embodiment, the digital circuitry 30 employs a cross-talk algorithm which mitigates interference on the reception signal due to the transmission signal from the same remote radio head. The cross-talk algorithm models how the transmitted signal generates interference as seen in the receiver, whereby the interference can be subtracted from the received signal. This algorithm improves receiver performance when transmitter is concurrently active.

The digital circuitry 30 can be configured to perform any combination of one or more of the functions described above.

In one embodiment, the digital circuitry 30 is configured to reduce common mode interference for the transmit path where the signal has passed through a cable from the IRU. The common mode interference is first measured and then subtracted from the transmission signal (or transmission signals in the MIMO case). In one embodiment, the common mode interference is measured on an unused wire pair of the cable (which then needs to be passed through an ADC such as the first ADC 31*a*). In one embodiment, the common mode interference is measured when there is a gap in transmission signals from the IRU. In this way, the effect of any interference affecting the cable can be efficiently reduced or even eliminated.

Figure 4A:
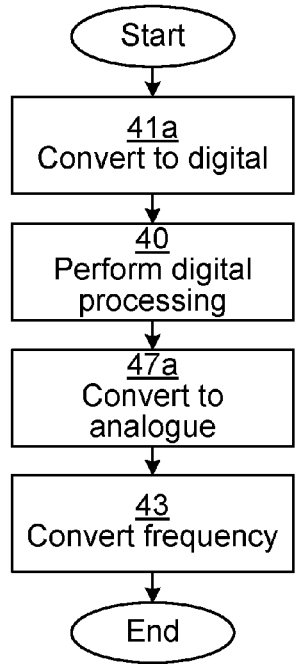
FIGS. 4A-C are flow charts illustrating embodiments of methods performed in a remote radio head of FIGS. 1A-B for providing a radio interface for a network node.
Figure 4B:
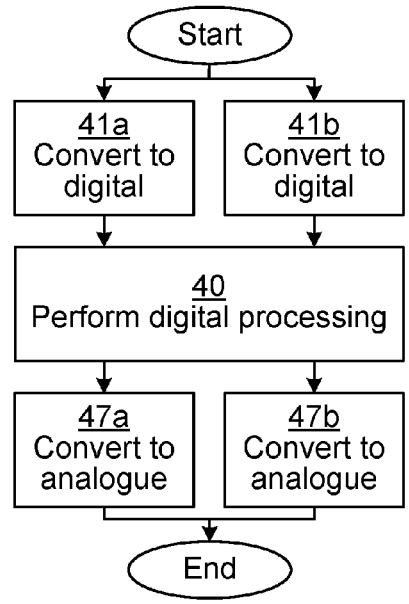
Figure 4C:
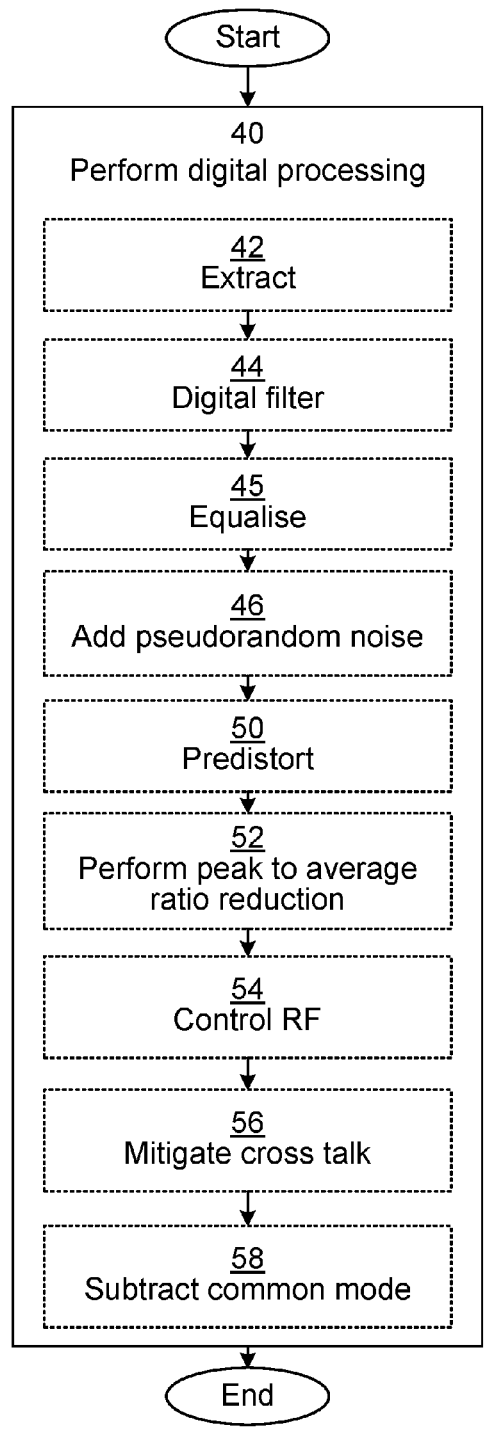

FIGS. 4A-C are flow charts illustrating embodiments of methods performed in a remote radio head of FIGS. 1A-B for providing a radio interface for a network node. The method is started when the remote radio head becomes operational and can be continuously repeated as long as the remote radio head is operational. The methods are equivalent to the embodiments described above with reference to FIG. 3.

Looking first to FIG. 4A, in a convert to digital step 41*a*, an analogue signal is converted to a digital signal for digital circuitry of the remote radio head in an ADC (31*a*/31*b* of FIG. 3). The analogue signal is provided by the analogue interface or by the antenna of the remote radio head.

In a perform digital processing step 40, transmission and/or reception signals are processed. In other words, only transmission signals can be processed, only reception signals can be processed or both transmission and reception signals can be processed.

In a convert to analogue step 47*a*, a digital signal from the digital circuitry is converted to an analogue signal, the analogue signal being provided to the analogue interface 39 or the antenna 25.

In a convert frequency step 43, a conversion is performed between intermediate frequency signals of the analogue interface 39 and radio frequency, RF, signals of the antenna 25. This step can optionally be performed prior to the convert to digital step 41*a*, e.g. when the method is performed for reception signals.

FIG. 4B is a flow chart illustrating a method similar to the method illustrated in FIG. 4A. Only new steps or steps which are modified compared to the method illustrated in FIG. 4A will be described. In FIG. 4B, paths for both transmission and reception signals are shown. Here, the convert frequency step is omitted for reasons of clarity, but may nevertheless also be performed.

Specifically, there is here a second convert to digital step 41*b* performed in a second one of two available ADCs, in which an analogue signal from the antenna is converted to a digital signal for the digital circuitry. Since the analogue signal comes from the antenna, this step relates to a reception signal.

In this embodiment, the first convert to digital 41*a* step comprises converting an analogue signal from the analogue interface to a digital signal for the digital circuitry, thereby relating to a transmission signal.

In a second convert to analogue step 47*b*, performed in a second one of two available DACs, a digital signal is converted from the digital circuitry to an analogue signal being provided to the analogue interface. Hence, this relates to the reception signal.

In this embodiment, the first convert to analogue step 47*a* comprises converting a digital signal from the digital circuitry to an analogue signal being provided to the antenna, thus relating to the transmission signal.

The step of performing digital signal processing is capable of processing both reception signals and transmission signals. This may be implemented using one or more components as appropriate.

FIG. 4C is a flow chart illustrating optional steps performed in the perform digital processing step 40 of FIGS. 4A-B. It is to be noted that all steps below are optional no steps or and any number of these steps can be performed. All of these steps are performed in the digital circuitry 30.

In an optional extract step 42, a plurality of separate channels of respective separate spectral bands are extracted from a single input signal.

In an optional digital filter step 44, unwanted spectral components are digitally filtered out in the digital circuitry.

In an optional equalise step 45, amplitude equalisation is performed to compensate for a non-ideal frequency response of a cable between the remote radio head and the network node.

In an optional add pseudorandom noise step 46, a known pseudorandom noise like signal is added to a received signal for desensitation.

In an optional predistort step 50, digital predistortion is performed to compensate for non-linear transmission.

In an optional perform peak to average ratio reduction step 52, a reduction of peak to average ratio of the transmission signal is performed.

In an optional control RF step 54, the RF circuitry is controlled using any one or more of the following parameters: a biasing condition of a power amplifier, an antenna impedance of a component connected to antenna, a filter response of the RF radio circuitry, or operation frequency of the RF circuitry.

In an optional mitigate cross-talk step 56, a cross-talk algorithm is employed which mitigates interference on the reception signal due to the transmission signal from the same remote radio head. The cross-talk algorithm models how the transmitted signal generates interference as seen in the receiver, whereby the interference can be subtracted from the received signal. This algorithm improves receiver performance when transmitter is concurrently active.

In an optional subtract common mode step 58, common mode interference is subtracted for the transmit path where the signal has passed through a cable from the IRU. The common mode interference is first measured and then subtracted from the transmission signal (or transmission signals in the MIMO case). In one embodiment, the common mode interference is measured on an unused wire pair of the cable (which then needs to be passed through an ADC such as the first ADC 31*a*). In one embodiment, the common mode interference is measured when there is a gap in transmission signals from the IRU. In this way, the effect of any interference affecting the cable from the IRU can be efficiently reduced or even eliminated.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A remote radio head configured to provide a radio interface for a network node, the remote radio head comprising:
   an antenna;
   an analogue interface for connecting with the network node;
   radio frequency (RF) circuitry configured to convert between intermediate frequency signals of the analogue interface and RF signals of the antenna;
   digital circuitry configured to process transmission and/or reception signals;
   a first analogue to digital converter (ADC) connected to the digital circuitry;
   a first digital to analogue converter (DAC) connected to the digital circuitry;
   wherein the first ADC, the digital circuitry, and the first DAC are connected between the antenna and the analogue interface for receiving or transmitting radio signals;
   a second ADC connected between the antenna and the digital circuitry; and
   a second DAC, connected between the analogue interface and the digital circuitry;
   wherein the first ADC is connected between the analogue interface and the digital circuitry, and the first DAC is connected between the antenna and the digital circuitry.

2. The remote radio head according to claim 1, wherein the digital circuitry is configured to digitally filter out unwanted spectral components.

3. A remote radio head configured to provide a radio interface for a network node, the remote radio head comprising:
   an antenna;
   an analogue interface for connecting with the network node;
   radio frequency (RF) circuitry configured to convert between intermediate frequency signals of the analogue interface and RF signals of the antenna;
   digital circuitry configured to process transmission and/or reception signals;
   a first analogue to digital converter (ADC) connected to the digital circuitry; and
   a first digital to analogue converter (DAC) connected to the digital circuitry;
   wherein the first ADC, the digital circuitry, and the first DAC are connected between the antenna and the analogue interface for receiving or transmitting radio signals, and
   wherein the digital circuitry is further configured to perform amplitude equalisation to compensate for a non-ideal frequency response of a cable between the remote radio head and the network node.

4. A remote radio head configured to provide a radio interface for a network node, the remote radio head comprising:
   an antenna;
   an analogue interface for connecting with the network node;
   radio frequency (RF) circuitry configured to convert between intermediate frequency signals of the analogue interface and RF signals of the antenna;
   digital circuitry configured to process transmission and/or reception signals;
   a first analogue to digital converter (ADC) connected to the digital circuitry; and
   a first digital to analogue converter (DAC) connected to the digital circuitry;
   wherein the first ADC, the digital circuitry, and the first DAC are connected between the antenna and the analogue interface for receiving or transmitting radio signals, and
   wherein the digital circuitry is further configured to extract a plurality of separate channels of respective separate spectral bands from a single input signal.

5. A remote radio head configured to provide a radio interface for a network node, the remote radio head comprising:
   an antenna;
   an analogue interface for connecting with the network node;
   radio frequency (RF) circuitry configured to convert between intermediate frequency signals of the analogue interface and RF signals of the antenna;
   digital circuitry configured to process transmission and/or reception signals;
   a first analogue to digital converter (ADC) connected to the digital circuitry; and
   a first digital to analogue converter (DAC) connected to the digital circuitry;
   wherein the first ADC, the digital circuitry, and the first DAC are connected between the antenna and the analogue interface for receiving or transmitting radio signals, and wherein the digital circuitry is further configured to add a known pseudorandom noise like signal to a received signal for desensitation.

6. The remote radio head according to claim 1, wherein the digital circuitry is further configured to perform digital predistortion to compensate for non-linear transmission.

7. A remote radio head configured to provide a radio interface for a network node, the remote radio head comprising:
   an antenna;
   an analogue interface for connecting with the network node;
   radio frequency (RF) circuitry configured to convert between intermediate frequency signals of the analogue interface and RF signals of the antenna;
   digital circuitry configured to process transmission and/or reception signals;
   a first analogue to digital converter (ADC) connected to the digital circuitry; and
   a first digital to analogue converter (DAC) connected to the digital circuitry;
   wherein the first ADC, the digital circuitry, and the first DAC are connected between the antenna and the analogue interface for receiving or transmitting radio signals, and
   wherein the digital circuitry is further configured to perform peak to average ratio reduction of the transmission signal.

8. A remote radio head configured to provide a radio interface for a network node, the remote radio head comprising:
   an antenna;
   an analogue interface for connecting with the network node;
   radio frequency (RF) circuitry configured to convert between intermediate frequency signals of the analogue interface and RF signals of the antenna;
   digital circuitry configured to process transmission and/or reception signals;
   a first analogue to digital converter (ADC) connected to the digital circuitry; and
   a first digital to analogue converter (DAC) connected to the digital circuitry;
   wherein the first ADC, the digital circuitry, and the first DAC are connected between the antenna and the analogue interface for receiving or transmitting radio signals, and
   wherein the digital circuitry is further configured to control the RF circuitry using any one or more of the following parameters: a biasing condition of a power amplifier, an antenna impedance of a component connected to antenna, filter response of the RF radio circuitry, to change operation frequency of the RF circuitry.

9. The remote radio head according to claim 1, wherein the digital circuitry is connected to a bi-directional control interface for control by an external node.

10. A remote radio head configured to provide a radio interface for a network node, the remote radio head comprising:
    an antenna;
    an analogue interface for connecting with the network node;
    radio frequency (RF) circuitry configured to convert between intermediate frequency signals of the analogue interface and RF signals of the antenna;
    digital circuitry configured to process transmission and/or reception signals;
    a first analogue to digital converter (ADC) connected to the digital circuitry; and
    a first digital to analogue converter (DAC) connected to the digital circuitry;
    wherein the first ADC, the digital circuitry, and the first DAC are connected between the antenna and the analogue interface for receiving or transmitting radio signals, and
    wherein the RF circuitry is provided between the first ADC and the antenna.

11. A method for providing a radio interface for a network node, the method being performed in a remote radio head connected to the network node and comprising the steps of:
    converting, in a first analogue to digital converter (ADC), an analogue signal to a digital signal for digital circuitry of the remote radio head, the analogue signal being provided by an analogue interface of the remote radio head or by an antenna of the remote radio head, the analogue interface being connected with the network node;
    digitally processing transmission and/or reception signals;
    converting in a first digital to analogue converter (DAC), a digital signal from the digital circuitry to an analogue signal, the analogue signal being provided to the analogue interface or the antenna;
    converting between intermediate frequency signals of the analogue interface and radio frequency (RF) signals of the antenna;
    converting, in a second ADC, an analogue signal from the antenna to a digital signal for the digital circuitry; and
    converting in a second DAC, a digital signal from the digital circuitry to an analogue signal being provided to the analogue interface;
    wherein the step of converting in the first ADC comprises converting an analogue signal from the analogue interface to a digital signal for the digital circuitry; and
    the step of converting in a first DAC comprises converting a digital signal from the digital circuitry to an analogue signal being provided to the antenna.

12. The method according to claim 11, wherein the step of digitally processing comprises the step of:
    digitally filtering out unwanted spectral components in the digital circuitry.

13. A method for providing a radio interface for a network node, the method being performed in a remote radio head connected to the network node and comprising the steps of:
    converting, in a first analogue to digital converter (ADC), an analogue signal to a digital signal for digital circuitry of the remote radio head, the analogue signal being provided by an analogue interface of the remote radio head or by an antenna of the remote radio head, the analogue interface being connected with the network node;
    digitally processing transmission and/or reception signals;
    converting in a first digital to analogue converter (DAC), a digital signal from the digital circuitry to an analogue signal, the analogue signal being provided to the analogue interface or the antenna;
    converting between intermediate frequency signals of the analogue interface and radio frequency (RF) signals of the antenna; and
    performing amplitude equalisation to compensate for a non-ideal frequency response of a cable between the remote radio head and the network node.

14. A method for providing a radio interface for a network node, the method being performed in a remote radio head connected to the network node and comprising the steps of:
  converting, in a first analogue to digital converter (ADC), an analogue signal to a digital signal for digital circuitry of the remote radio head, the analogue signal being provided by an analogue interface of the remote radio head or by an antenna of the remote radio head, the analogue interface being connected with the network node;
  digitally processing transmission and/or reception signals;
  converting in a first digital to analogue converter (DAC), a digital signal from the digital circuitry to an analogue signal, the analogue signal being provided to the analogue interface or the antenna; and
  converting between intermediate frequency signals of the analogue interface and radio frequency (RF) signals of the antenna;
  wherein the step of digitally processing comprises the step of:
    extracting a plurality of separate channels of respective separate spectral bands from a single input signal.

15. A method for providing a radio interface for a network node, the method being performed in a remote radio head connected to the network node and comprising the steps of:
  converting, in a first analogue to digital converter (ADC), an analogue signal to a digital signal for digital circuitry of the remote radio head, the analogue signal being provided by an analogue interface of the remote radio head or by an antenna of the remote radio head, the analogue interface being connected with the network node;
  digitally processing transmission and/or reception signals;
  converting in a first digital to analogue converter (DAC), a digital signal from the digital circuitry to an analogue signal, the analogue signal being provided to the analogue interface or the antenna; and
  converting between intermediate frequency signals of the analogue interface and radio frequency (RF) signals of the antenna;
  wherein the step of digitally processing comprises the step of:
    adding a known pseudorandom noise like signal to a received signal for desensitation.

16. The method according to claim 11, wherein the step of digitally processing comprises the step of:
  performing digital predistortion to compensate for non-linear transmission.

17. A method for providing a radio interface for a network node, the method being performed in a remote radio head connected to the network node and comprising the steps of:
  converting, in a first analogue to digital converter (ADC), an analogue signal to a digital signal for digital circuitry of the remote radio head, the analogue signal being provided by an analogue interface of the remote radio head or by an antenna of the remote radio head, the analogue interface being connected with the network node;
  digitally processing transmission and/or reception signals;
  converting in a first digital to analogue converter (DAC), a digital signal from the digital circuitry to an analogue signal, the analogue signal being provided to the analogue interface or the antenna; and
  converting between intermediate frequency signals of the analogue interface and radio frequency (RF) signals of the antenna;
  wherein the step of digitally processing comprises the step of:
    performing peak to average ratio reduction of the transmission signal.

18. A method for providing a radio interface for a network node, the method being performed in a remote radio head connected to the network node and comprising the steps of:
  converting, in a first analogue to digital converter (ADC), an analogue signal to a digital signal for digital circuitry of the remote radio head, the analogue signal being provided by an analogue interface of the remote radio head or by an antenna of the remote radio head, the analogue interface being connected with the network node;
  digitally processing transmission and/or reception signals;
  converting in a first digital to analogue converter (DAC), a digital signal from the digital circuitry to an analogue signal, the analogue signal being provided to the analogue interface or the antenna; and
  converting between intermediate frequency signals of the analogue interface and radio frequency (RF) signals of the antenna;
  wherein the step of digitally processing comprises the step of:
    controlling the RF circuitry using any one or more of the following parameters: a biasing condition of a power amplifier, an antenna impedance of a component connected to antenna, a filter response of the RF radio circuitry, or operation frequency of the RF circuitry.

19. The method according to claim 11, wherein the digital circuitry is connected to a bi-directional control interface for control by an external node.

* * * * *